(12) United States Patent
Thothadri et al.

(10) Patent No.: US 10,490,599 B2
(45) Date of Patent: Nov. 26, 2019

(54) COLLIMATED, DIRECTIONAL MICRO-LED LIGHT FIELD DISPLAY

(71) Applicant: Applied Materials, Inc., Santa Clara, CA (US)

(72) Inventors: Manivannan Thothadri, Mountain View, CA (US); Christopher Dennis Bencher, Cupertino, CA (US); Robert Jan Visser, Menlo Park, CA (US); John M. White, Hayward, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 45 days.

(21) Appl. No.: 15/904,100

(22) Filed: Feb. 23, 2018

(65) Prior Publication Data

US 2019/0019840 A1    Jan. 17, 2019

Related U.S. Application Data

(60) Provisional application No. 62/532,158, filed on Jul. 13, 2017.

(51) Int. Cl.
*H01L 27/15* (2006.01)
*G02B 27/22* (2018.01)
(Continued)

(52) U.S. Cl.
CPC ........ *H01L 27/156* (2013.01); *G02B 27/0983* (2013.01); *G02B 27/22* (2013.01); *H05B 33/0803* (2013.01)

(58) Field of Classification Search
CPC ... H01L 27/156; H01L 33/58; H01L 25/0753; H01L 33/32; H01L 33/20; H01L 33/24;
(Continued)

(56) References Cited

U.S. PATENT DOCUMENTS 6,736,512 B2   5/2004  Balogh
7,045,375 B1   5/2006  Wu et al.
(Continued)

FOREIGN PATENT DOCUMENTS

GB       2545155 A      6/2017
WO    2012081569 A1    6/2012
(Continued)

OTHER PUBLICATIONS

Henry, Bill—"A Multi-pixel LED Print-Head for Novel Imaging Applications," presented at the 28th International Conference on Digital Printing Technologies and Digital Fabrication 2012, held Sep. 9-13, 2012, in Quebec City, Quebec, Canada, pp. 277-279 of the Technical Program and Proceedings.
(Continued)

*Primary Examiner* — Koosha Sharifi-Tafreshi
(74) *Attorney, Agent, or Firm* — Patterson + Sheridan, LLP (57) ABSTRACT

Embodiments described herein provide for light field displays and methods of forming light field displays where micro-LED arrays are each configured to provide at least a macro-pixel of effective native hardware resolution, where each macro-pixel provides single pixel of spatial resolution and plurality of pixels of angular resolution, and where each pixel of angular resolution includes a plurality of sub-pixels each provided by a directional collimating micro-LED device described herein.

11 Claims, 10 Drawing Sheets

(51) Int. Cl.
*H05B 33/08* (2006.01)
*G02B 27/09* (2006.01)

(58) Field of Classification Search
CPC .............. G02B 27/2214; G02B 3/0056; G02B 27/0172; G02B 3/0006
See application file for complete search history.

(56) References Cited

U.S. PATENT DOCUMENTS

| | | | |
|---|---|---|---|
| 7,518,149 B2 | 4/2009 | Maaskant et al. | |
| 7,638,808 B2 | 12/2009 | Owen et al. | |
| 8,362,695 B2 | 1/2013 | Aanegola et al. | |
| 9,450,148 B2 | 9/2016 | Shepherd | |
| 9,502,595 B2 | 11/2016 | Percival | |
| 9,559,250 B2 | 1/2017 | Bonar et al. | |
| 10,256,382 B2 | 4/2019 | White et al. | |
| 2004/0070337 A1 | 4/2004 | Goh et al. | |
| 2006/0113638 A1* | 6/2006 | Maaskant | H01L 31/035281 257/623 |
| 2006/0238545 A1 | 10/2006 | Bakin et al. | |
| 2007/0217473 A1 | 9/2007 | Abe et al. | |
| 2010/0203448 A1 | 8/2010 | Teshima et al. | |
| 2013/0207964 A1 | 8/2013 | Fleck et al. | |
| 2014/0300709 A1 | 10/2014 | Futterer et al. | |
| 2015/0008392 A1* | 1/2015 | Bonar | H01L 33/405 257/13 |
| 2015/0070476 A1 | 3/2015 | Wei | |
| 2015/0070657 A1 | 3/2015 | Said | |
| 2015/0288935 A1 | 10/2015 | Shinozaki | |
| 2016/0076731 A1 | 3/2016 | Monch et al. | |
| 2016/0313180 A1 | 10/2016 | Percival et al. | |
| 2017/0025469 A1 | 1/2017 | Percival | |
| 2017/0038028 A1 | 2/2017 | Cho et al. | |
| 2017/0054060 A1 | 2/2017 | Hashiya et al. | |
| 2017/0213502 A1 | 7/2017 | Henry et al. | |
| 2017/0223344 A1* | 8/2017 | Kaehler | G02B 27/2214 |
| 2017/0271557 A1* | 9/2017 | Brennan | H01L 33/20 |
| 2017/0316736 A1 | 11/2017 | Hughes et al. | |
| 2018/0132330 A1* | 5/2018 | Chong | H01L 27/156 |
| 2018/0356767 A1* | 12/2018 | Lu | G03H 1/0465 |

FOREIGN PATENT DOCUMENTS

| | | |
|---|---|---|
| WO | 2016016461 A1 | 2/2016 |
| WO | 2017087033 A1 | 5/2017 |

OTHER PUBLICATIONS

Maaskant, Pleun P. et al.—"High-Speed Substrate-Emitting Micro-Light-Emitting Diodes for Applications Requiring High Radiance," published online Jan. 24, 2013, 2013 The Japan Society of Applied Physics, pp. 022102-1-022102-3.

TOPCO—Directional light extraction enhancement from GaN-based light-emitting diodes with photonic crystal nano-structures, 2009, SC030015, 30 pages.

Wetzstein, Gordon et al.—"Tensor Displays: Comprehensive Light Field Synthesis using Multilayer Displays with Directional Backlighting," date unknown, 11 pages.

PCT International Search Report and Written Opinion dated Sep. 18, 2018, for International Application No. PCT/US2018/034903.

\* cited by examiner

610 — PICKING ONE OR MORE PRE-SINGULATED MICRO-LED DEVICES FROM A STRUCTURAL BASE, WHEREIN THE ONE OR MORE PRE-SINGULATED MICRO-LED DEVICES EACH COMPRISE:

AN ACTIVE LAYER STACK;

A TRANSPARENT CONDUCTIVE OXIDE (TCO) LAYER DISPOSED ON THE ACTIVE LAYER STACK, WHEREIN THE TCO LAYER AND AT LEAST A PORTION OF THE ACTIVE LAYER STACK FORMS A SUBSTANTIALLY CIRCULAR PARABOLOID SHAPE;

AN ELECTRICALLY INSULATING LAYER DISPOSED ON THE TCO LAYER, THE ELECTRICALLY INSULATING LAYER HAVING AN OPENING FORMED THEREIN; AND

A REFLECTIVE LAYER DISPOSED ON THE ELECTRICALLY INSULATING LAYER, WHEREIN A REFLECTIVE SURFACE OF THE REFLECTIVE LAYER FORMS A SUBSTANTIALLY CIRCULAR PARABOLIC MIRROR, AND WHEREIN THE AXIS OF SYMMETRY OF THE REFLECTIVE SURFACE IS NOT ORTHOGONAL TO MAJOR SURFACES OF THE ACTIVE LAYER STACK; AND

620 — PLACING THE ONE OR MORE PRE-SINGULATED MICRO-LED DEVICES ON A RECEIVING SURFACE OF A DISPLAY PANEL.

FIG. 7C

# COLLIMATED, DIRECTIONAL MICRO-LED LIGHT FIELD DISPLAY

CROSS-REFERENCE TO RELATED APPLICATIONS

This application claims priority to United States Provision Application Ser. No. 62/532,158, filed on Jul. 13, 2017, which is herein incorporated by reference in its entirety.

BACKGROUND

Field

Embodiments of the present disclosure generally relate to light field displays and methods of forming light field displays, in particular, light field displays formed of directional collimating micro-LED devices, directional collimating micro-LED devices, and methods of forming the directional collimating micro-LED devices.

Description of the Related Art

Figure 1:
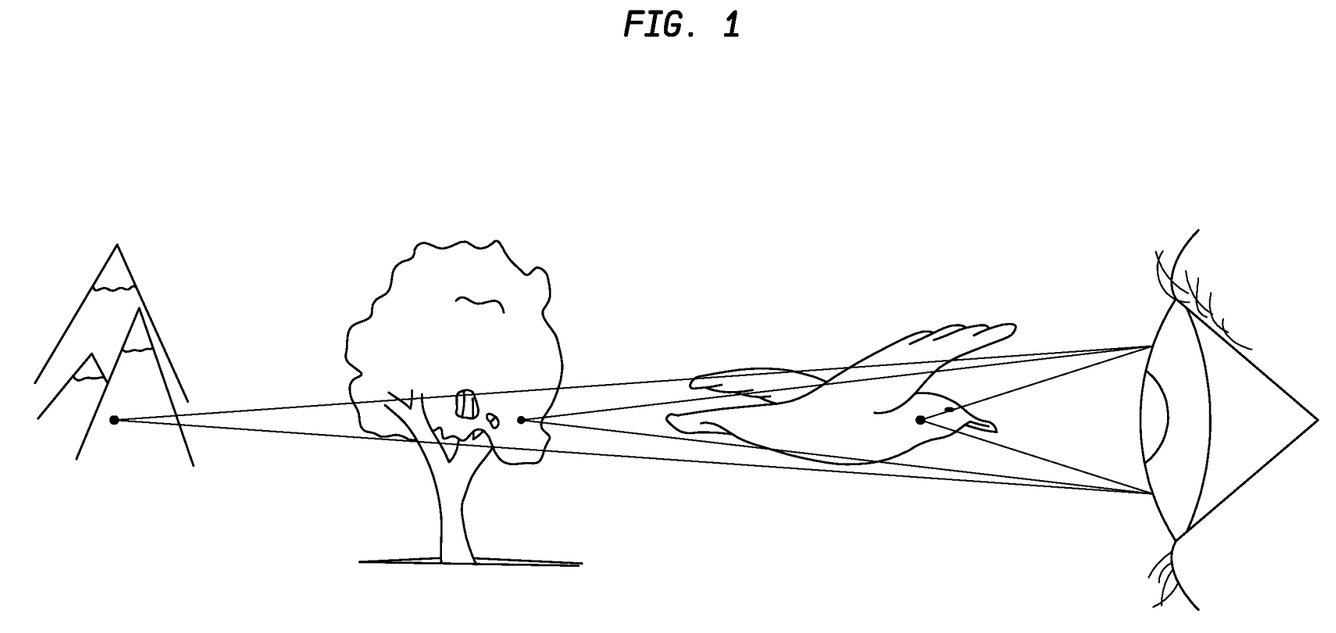
FIG. 1 illustrates angular light information from the perspective of a viewer.

Long held beliefs that our three dimensional (3D) perception of the world around us is primarily related to stereoscopic vision (where the convergence and/or divergence of two dimensional images viewed separately by the left and right eye combine in the brain to give the perception of depth) have largely been proven untrue. We now know that, in addition to convergence/divergence, visual cues from head and eye movements substantially influence a person's ability to perceive the world about them in three dimensions. For example, if the viewer in FIG. 1 moves her head from side to side she will perceive a relative motion between the bird and the mountain that is more than the relative motion she perceives between the bird and the tree, thereby indicating the mountain is the furthest away, which is generally known as motion parallax. Similarly, if she focuses her eye on the bird, the mountain will appear to be more blurry than the tree, another indication of the relative distances of the tree and the mountain compared to the bird, which is generally known as blur cue interpretation. Both motion parallax and blur cue interpretation, as well as other visual cues, require angular information which includes both the intensity of light rays reflected off a surface of an object and the angle of those light rays with respect to a focal plane of the viewer as they travel from the object to the viewer. Light rays of different angles, with respect to a focal plane of the viewer, reflected off the same surface of an object will have different intensities. Advances in the area of light field technology have provided light field cameras capable of capturing tremendous amounts of angular information, however, current display technologies are unable to capture and use all of the angular information captured by a light field camera for the display of the image without user input.

Accordingly, what is needed in the art are high angular resolution light field displays and methods of forming high angular resolution light field displays.

SUMMARY

Embodiments of the present disclosure generally relate to light field displays and methods of forming a light field display, in particular, light field displays formed of directional collimating micro-LED devices, methods of forming the light field displays, and methods of forming the directional collimating micro-LED devices.

In one embodiment, a light field display is provided. The light field display includes a plurality of micro-LED arrays, where each micro-LED array provides a pixel of spatial resolution comprising a plurality of pixels of angular resolution, where each micro-LED array comprises a plurality of micro-LED devices providing the plurality of pixels of angular resolution, and where each of the plurality micro-LED devices comprises a reflective surface forming a substantially circular parabolic mirror. In some embodiments, each micro-LED array of the light field display includes a plurality of micro-LED groups, where each of the plurality of micro-LED groups comprises at least three micro-LED devices, and where each of the at least three micro-LED devices provide different colors of light from each other to each provide a sub-pixel of angular resolution. In some embodiments, the at least three micro-LED devices of the light field display further comprise at least a blue light emitting micro-LED device, a green light emitting micro-LED device, and a red light emitting micro-LED device. In some embodiments, one or more of the plurality of micro-LED devices comprises an active layer stack and a transparent conductive oxide (TCO) layer disposed on the active layer stack, where the TCO layer and at least a portion of the active layer stack forms a substantially circular paraboloid shape, an electrically insulating layer disposed on the TCO layer, where the electrically insulating layer has an opening formed therein, and a reflective layer disposed on the electrically insulating layer, where the reflective layer comprises the reflective surface, and where the axis of symmetry of the reflective surface is not orthogonal to major surfaces of the active layer stack. In some embodiments, the active layer stack of the one or more of the plurality of micro-LED devices comprises an n-type layer, a p-type layer, and one or more quantum well layers interposed between the n-type layer and the p-type layer, where a focal point of the reflective surface is proximate to a surface the p-type layer. In some embodiments, the active layer stack provides a red light, a green light, or a blue light. In some other embodiments, the light field display comprises a plurality of mono-chromatic micro-LED devices.

In another embodiment, a micro-LED device is provided. The micro-LED device comprises an active layer stack, a transparent conductive oxide (TCO) layer disposed on the active layer stack, where the TCO layer and at least a portion of the active layer stack form a substantially circular paraboloid shape, an electrically insulating layer disposed on the TCO layer, where the electrically insulating layer has an opening formed therein, and a reflective layer disposed on the electrically insulating layer, where a reflective surface of the reflective layer forms a substantially circular parabolic mirror, and where the axis of symmetry of the reflective surface is not orthogonal to major surfaces of the active layer stack. In some embodiments, the active layer stack comprises an n-type layer, a p-type layer, and one or more quantum well layers interposed between the n-type layer and the p-type layer, and a focal point of the reflective surface is proximate to a surface the p-type layer. In some embodiments, the active layer stack provides a red light, a green light, or a blue light. In some other embodiments, the plurality of micro-LED devices are mono-chromatic.

In another embodiment, a method of forming one or more micro-LED devices is provided. The method includes depositing a resist layer on the surface of a substrate, the substrate comprising a structural base, an active layer stack disposed on the structural base, and a transparent conductive oxide (TCO) layer disposed on the active layer stack. The method further includes forming a pattern in the resist layer, where the pattern comprises one or more paraboloid shaped features, and where each of the one or more paraboloid shaped features has an axis of symmetry that is not orthogonal to major surfaces of the active layer stack. The method further includes transferring the pattern to the TCO layer and at least a portion of the active layer stack disposed there beneath to form a patterned substrate. The method further includes depositing an electrically insulating layer over the patterned substrate, forming one or more openings in the electrically insulating layer over the respective one or more paraboloid shaped features of the patterned substrate, and depositing a reflective layer over the electrically insulating layer, where a reflective surface of the reflective layer forms a substantially circular parabolic mirror, and where the axis of symmetry of the reflective surface is not orthogonal to major surfaces of the active layer stack. In some embodiments, the structural base comprises a lattice-matching material and one or more layers of the active layer stack epitaxially formed thereon. In some embodiments, the active layer stack comprises an n-type layer, a p-type layer, and one or more quantum well layers interposed between the n-type layer and the p-type layer. In some embodiments, a focal point of the reflective surface is proximate to a surface the p-type layer. In some embodiments, the method further includes selectively treating a surface of the p-type layer to form a light emissive region about the focal point and a non or low light emissive region circumscribing the light emissive region. In some embodiments, the active layer stack provides a red light, a green light, or a blue light. In some embodiments, forming a pattern in the resist layer comprises an imprint lithography process, a grey-scale lithography process, a tilted directional etch process, or a combination thereof. In some embodiments, the method further includes removing the one or more micro-LED devices from the structural base. In some embodiments, the micro-LED device comprises the active layer stack, the transparent conductive oxide (TCO) layer disposed on the active layer stack, the electrically insulating layer, and the reflective layer.

In another embodiment, a method of forming a light field display is provided. The method includes picking one or more pre-singulated micro-LED devices from a structural base, where the one or more pre-singulated micro-LED devices each comprise an active layer stack, a transparent conductive oxide (TCO) layer disposed on the active layer stack, wherein the TCO layer and at least a portion of the active layer stack forms a substantially circular paraboloid shape, an electrically insulating layer disposed on the TCO layer, the electrically insulating layer having an opening formed therein, and a reflective layer disposed on the electrically insulating layer, where a reflective surface of the reflective layer forms a substantially circular parabolic mirror, and where the axis of symmetry of the reflective surface is not orthogonal to major surfaces of the active layer stack. The method further includes placing the one or more pre-singulated micro-LED devices on a receiving surface of a display panel.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only exemplary embodiments and are therefore not to be considered limiting of its scope, for the disclosure may admit to other equally effective embodiments.

To facilitate understanding, identical reference numerals have been used, where possible, to designate identical elements that are common to the figures. It is contemplated that elements and features of one embodiment may be beneficially incorporated in other embodiments without further recitation.

DETAILED DESCRIPTION

Embodiments of the present disclosure generally relate to light field displays and methods of forming light field displays, in particular, light field displays formed of directional collimating micro-LED devices, directional collimating micro-LED devices, and methods of forming the directional collimating micro-LED devices.

Figure 2A:
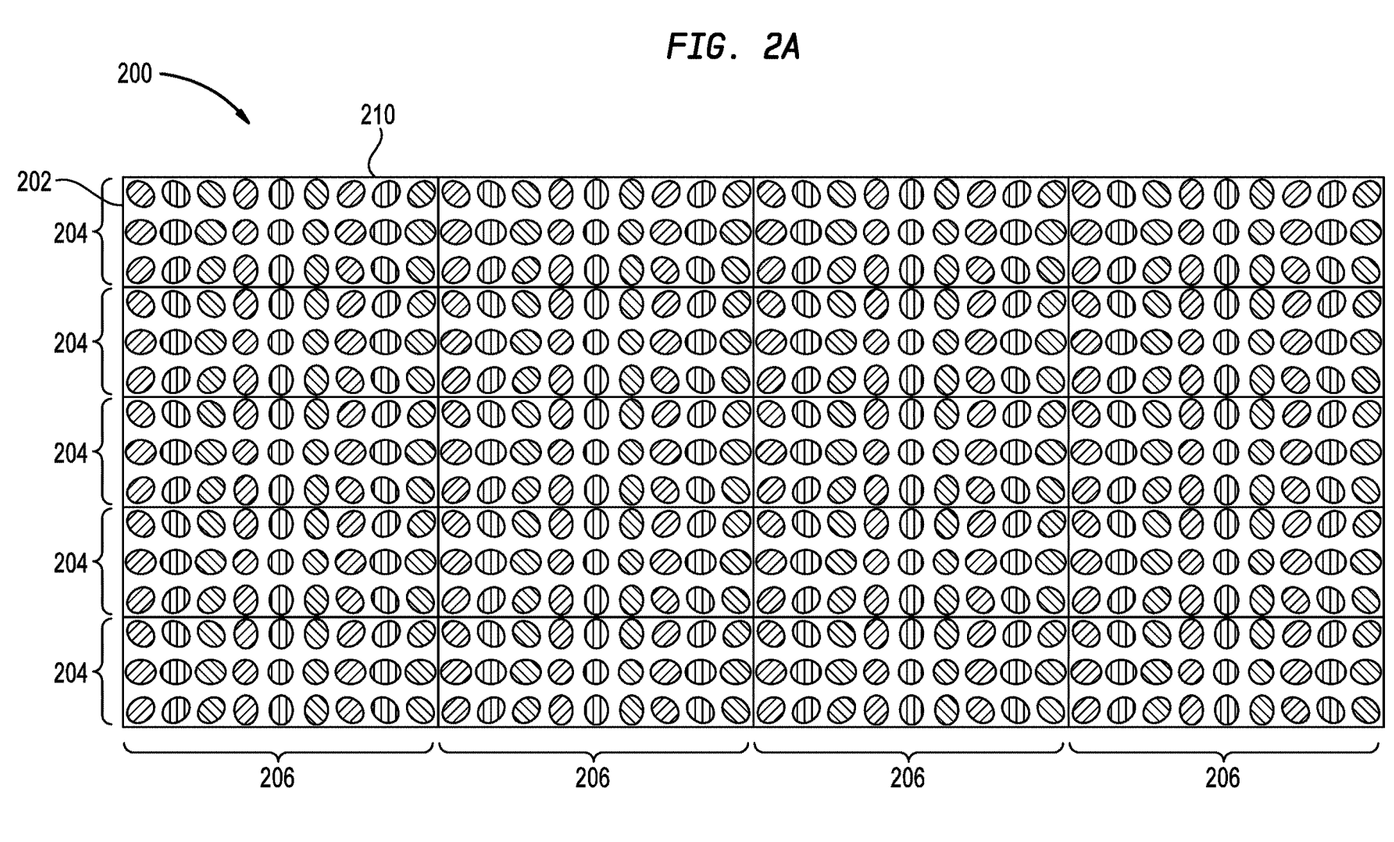
FIG. 2A is a schematic view of a light field display, according to one embodiment.

FIG. 2A is a schematic view of a light field display, according to one embodiment. The light field display 200 in FIG. 2A is a direct view LED light field display which includes a plurality of micro-LED arrays 202 herein arranged in 5 rows and 4 columns, where each micro-LED array 202 provides a macro-pixel of resolution of the light-field display, which is 20 macro-pixels for the 4×5 array shown in FIG. 2A, i.e., a macro-pixel is present at each column-row intersection. A macro-pixel provides a single pixel of spatial resolution and a plurality of pixels of angular (i.e., directional) resolution, where the number of macro-pixels and the number of pixels of angular resolution per macro-pixel determine the effective native hardware pixel resolution of the light field display 200. For example, a light field display comprising 1920×1080 pixels of spatial resolution, where each pixel of spatial resolution comprises 25 pixels of angular resolution has an effective light field resolution of 48000×27000. As shown in FIG. 2A, the plurality of micro-LED arrays 202 are arranged in a grid pattern comprising a plurality of parallel rows 204 and a plurality of parallel columns 206 that are orthogonal to the plurality of parallel rows 204. In other embodiments, the plurality of micro-LED arrays 202 are arranged in any other suitable pattern, such as hexagonal pattern.

Figure 2B:
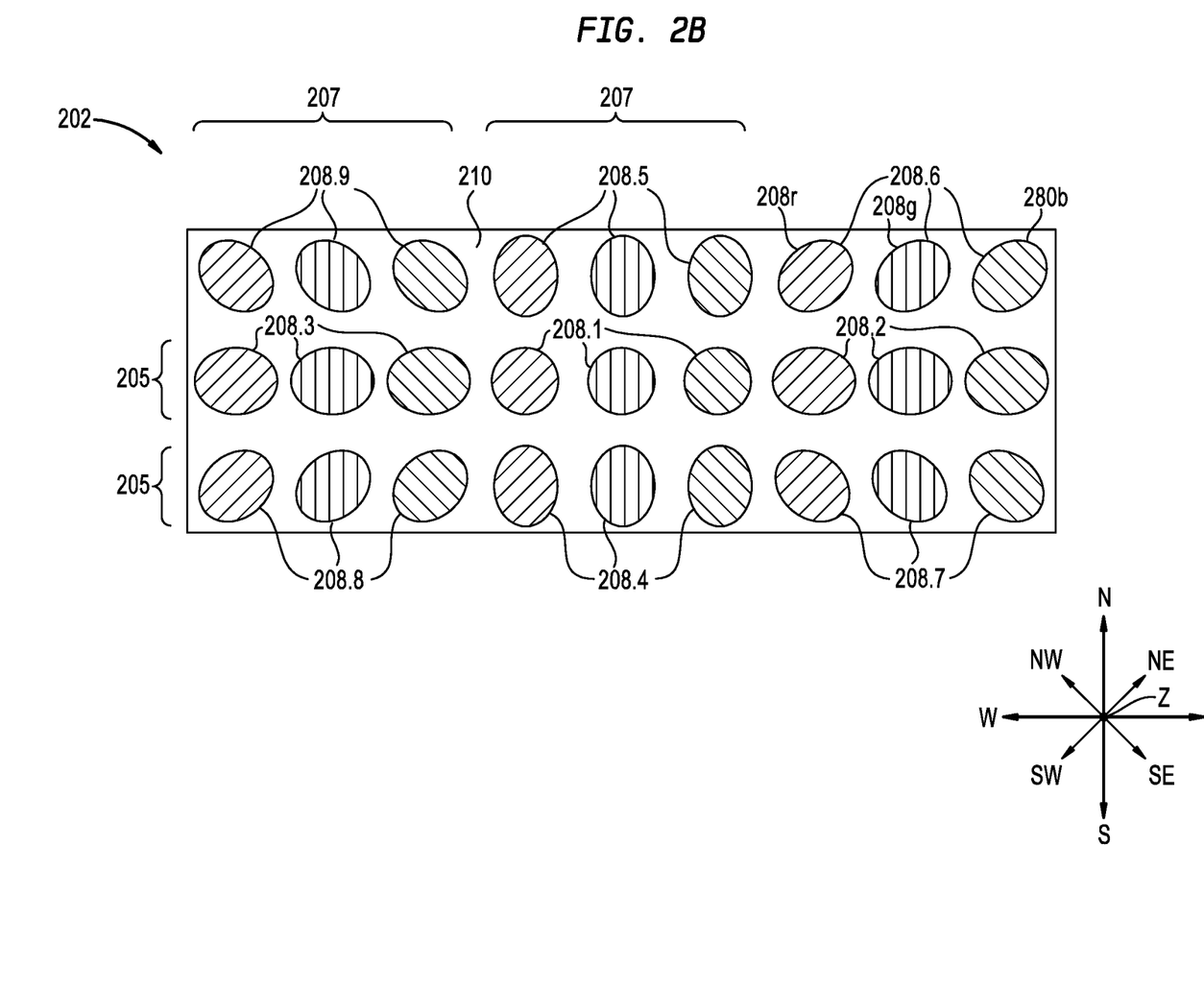
FIG. 2B is a close up view of one of the micro-LED arrays of the light field display described in FIG. 2A.
Figures 2C, 2D:
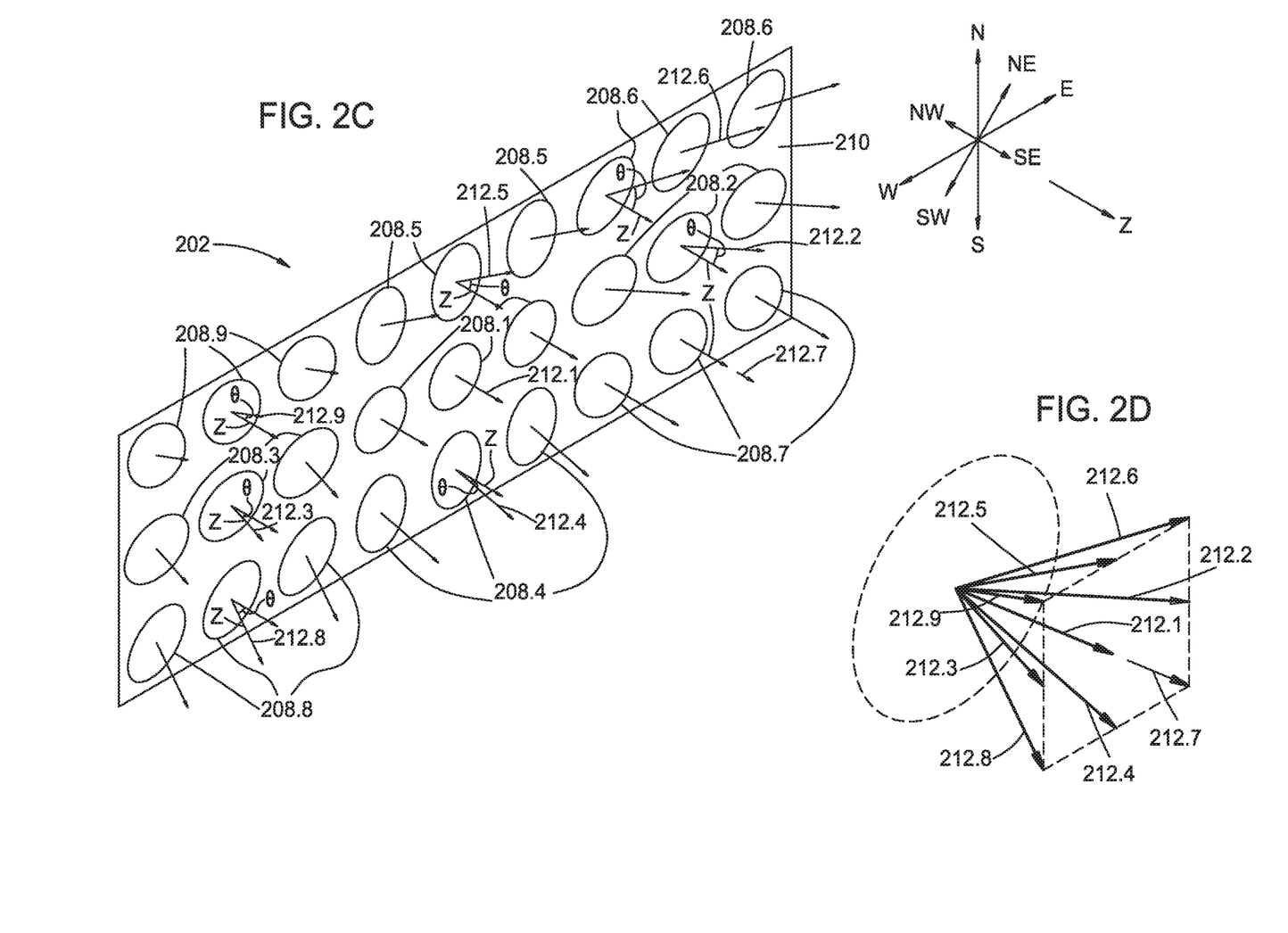
FIG. 2C is an isometric view of the micro-LED array described in FIG. 2B.
FIG. 2D is a close up view of directed collimated light provided by the micro-LED array described in FIG. 2C.

FIG. 2B is a close up view of one of the micro-LED arrays 202 of the light field display 200 shown in FIG. 2A. FIG. 2C is an isometric view of the micro-LED array 202 described in FIG. 2B. FIG. 2D further illustrates the directed collimated light rays 212.1-212.9 provided by respective micro-LED groups 208.1-208.9 of the micro-LED array 202 described in FIGS. 2B-2C. Herein, each micro-LED array 202 comprises a plurality micro-LED groups 208.1-208.9, where each of the plurality of micro-LED groups 208.1-208.9 includes three micro-LED devices, a red micro-LED device 203r, a green micro-LED device 203g, and a blue micro-LED device 203b. Typically, red micro-LED devices 203r provide light having a wavelength in the range between about 620 nm and about 780 nm, green micro-LED devices 203g provide light having a wavelength in the range between about 495 nm and about 580 nm, and blue micro-LED devices 203b provide light having wavelengths in the range between about 450 nm and about 495 nm.

In the micro-LED arrays 202, and as shown in FIGS. 2C and 2D, each micro-Led has a preferential primary direction of light emission with respect to the display surface 210. Thus, each of the micro-LEDs are configured and arranged in the micro-LED array 202 to direct light in a direction measured with respect to the deviation of the primary emission direction from the Z-direction normal to the surface of the micro-LED array 202, here angle θ, and a directional component based on the North (N), east (E), south(S) and west (W) directions in the plane of the display surface 210, and where N is here set to be a direction extending directly upwardly when from the perspective of a viewer viewing the micro-LED array of FIGS. 2B and 2C. Thus, the primary light emission direction of each micro-Led can be notated as (direction, angle θ), where the direction is based on the NSEW, i.e., compass, direction coordinates, except where the primary emission direction is the Z direction substantially normal to the display surface 210, and the angle θ is the angle is the angle between the primary emission direction of the micro-LED and the Z-axis. Thus, for example, the primary emission direction of the micro-LEDs 208.1 is the Z-direction, and they therefore have the notation (none, 0), wherein the emission direction does not have a NSEW direction because it is orthogonal to the array surface, and the angle is 0 because it does not deviate from the Z direction. Slight angular deviation is not considered in this notation.

Herein, the directional components N, S, E, and W respectively correspond to the upward, downward, rightward, and leftward directions of a display surface 210 of the light field display 200, and/or the micro-LED arrays 202 thereof, from the perspective of a viewer facing the micro LED array 202. Collimated light emanating from the light field display 200 in rays, such as collimated light rays 212.1, that are orthogonal to the display surface 210 are emanating in the Z direction where the angle θ of the light rays with respect to the Z direction perpendicular to the display surface 210 is about 0, and collimated light rays emanating from the display surface 210 in a direction that is not orthogonal to the display surface 210, such as collimated light rays 212.2-212.9, deviate from the Z direction at the display surface 210 by an angle θ and in a N, S, E, or W direction, or a direction therebetween, for example a NE direction which is halfway between N and E or 45° clockwise from N, a SE direction which is halfway between E and S or 135° clockwise from N, a SW direction which is halfway between S and W or 180° clockwise from N, or a NW direction which is halfway between N and W or 225° clockwise from N. Herein, micro-LED groups 208.2-208.9 are each configured to respectively direct collimated light rays 212.1-212.9 in E, W, S, N, NE, SE, SW, and NW directions at the angle θ (shown in FIG. 2C) with respect to the Z axis, where the angle θ is between more than 0° and less than about 45°, such as between more than 0° and about 30°, such as between about 0.5° and about 30°. In one embodiment, the micro-LED groups 208.2-208.9 are each configured to respectively direct collimated light rays 212.2-212.9 in a respective E, W, S, N, NE, SE, SW, and NW direction where each of the respective collimated light rays 212.2-212.9 diverge from the Z direction at the surface of the display by the angle θ, where the angle θ is between about more than 0° and about 5°. In further embodiments, additional micro-LED groups 208 in the micro-LED array 202 are configured to provide collimated directed light in further directions, such as directions between E, W, S, N, NE, SE, and NW directions and/or at different angles from the Z-direction such as θ+x where x is between more than 0° and 10°, such as between more than 0° and about 5°.

Typically, each of the micro-LED devices 203r,g,b in a micro-LED group 208.1-208.9 is located adjacent and/or proximate to another micro-LED device 203r,g, or b of the same micro-LED group 208.1-208.9. In other embodiments, micro-LED devices 203r,g,b of each respective micro-LED group 208.1-208.9 are positioned at locations within the micro-LED array 202 that are distal from and/or not adjacent to the other micro-LED devices 203r,g, or b of the same micro-LED group 208. Herein, the micro-LED groups 208.1-208.9 include at least one of each of a red micro-LED device 203r, a green micro-LED device 203g, and a blue micro-LED device 203b, where each micro-LED device 203r,g, or b of an RGB micro-LED group 208.1-208.9 is configured to direct collimated light in substantially the same direction from the display surface 210 as the other micro-LED devices 203r,g, or b of the same group.

In other embodiments, the micro-LED arrays 202 of the light field display 200 include a plurality of monochromatic micro-LED's (not shown) where the plurality of monochromatic micro-LED's are configured to direct collimated light in a corresponding plurality of directions from the display surface 210. Typically, the light provided by the plurality of monochromatic micro-LED's falls in the visible spectrum. In other embodiments, each of the micro-LED groups 208 includes at least a micro-LED device for emitting a first color light and at least a micro-LED device for emitting a second color light, where the first and second colors of light are different and where each micro-LED device 203 of the micro-LED group 208 is configured to direct collimated light in substantially the same direction as the other micro-LED devices 203 of the same micro-LED group 208. In some other embodiments, each of the micro-LED groups 208 comprise 3 or more micro-LED's that each emit a different color of light, where each of the 3 or more micro-LED devices 203 in the micro-LED group is configured to direct collimated light rays 212 in substantially the same direction from the display surface 210.

The micro-LED arrays 202 shown in FIGS. 2A-2B comprise a 3×3 array of micro-LED groups 208.1-208.9 that form a macro-pixel of the display where the macro-pixel provides a single pixel of spatial resolution and 9 pixels of angular (i.e., directional) resolution, and where each pixel of angular resolution includes at least 3 sub-pixels provided by the micro-LED devices 203r,g,b. In further embodiments, the micro-LED array 202 is configured to provide more than 9 pixels of angular resolution, such as 16 pixels of angular resolution provided by a 4×4 array of 16 micro-LED groups 208 each configured to direct collimated light in a different direction from the display surface 210, or 25 pixels of angular resolution provided by a 5×5 array of 25 micro-LED groups 208, or any number of micro-LED groups 208 required to provide the desired angular resolution, for example in some embodiments the micro-LED array 202 comprises an array of 1920×1080 micro-LED groups or about 2.07M micro-LED groups configured to provide about 2.07M pixels of angular resolution. In some embodiments, the micro-LED array 202 will include the micro-LED group 208.1 configured to provide collimated light rays 212.1 substantially in the Z-direction i.e., substantially orthogonal to the display surface 210, a first plurality of micro-LED groups, such as micro-LED groups 208.2-208.9, configured to provide collimated light rays, such as collimated light rays 212.2-212.9, in a plurality of compass directions deviating from the Z-direction by a first angle, such as the angle θ, and a second plurality of micro-LED groups (not shown) configured to provide collimated light rays in the plurality of compass directions deviating from the Z-direction by a second angle, such as θ+x.

Typically, each plurality of micro-LED groups includes more than 4 micro-LED groups, such as more than 6 micro-LED groups, for example at least 8 micro-LED groups. In some embodiments, each micro-LED array 202 will comprise more than 2 pluralities of micro-LED groups, where each of the pluralities of micro-LED groups is configured to direct collimated light rays at a different angle θ from the Z-direction. In other embodiments, the micro-LED array 202 includes more than one plurality of monochromatic micro-LED devices, where each of the pluralities of monochromatic micro-LED devices is configured to direct collimated light rays in a plurality of compass directions, and where each of the pluralities of monochromatic micro-LED devices is configured to direct light collimated light rays at a different angle θ from the Z-direction that the other pluralities of monochromatic micro-LED devices.

In FIG. 2B the plurality of micro-LED groups 208.1-208.9 are arranged in a grid pattern comprising a plurality of parallel rows 205 and a plurality of parallel columns 207 orthogonal to the plurality of parallel rows 205. In other embodiments, the plurality of micro-LED groups 208.1-208.9 and/or the micro-LED devices thereof, are arranged in other suitable patterns within the micro-LED array 202, such as in a hexagonal pattern.

Figure 3A:
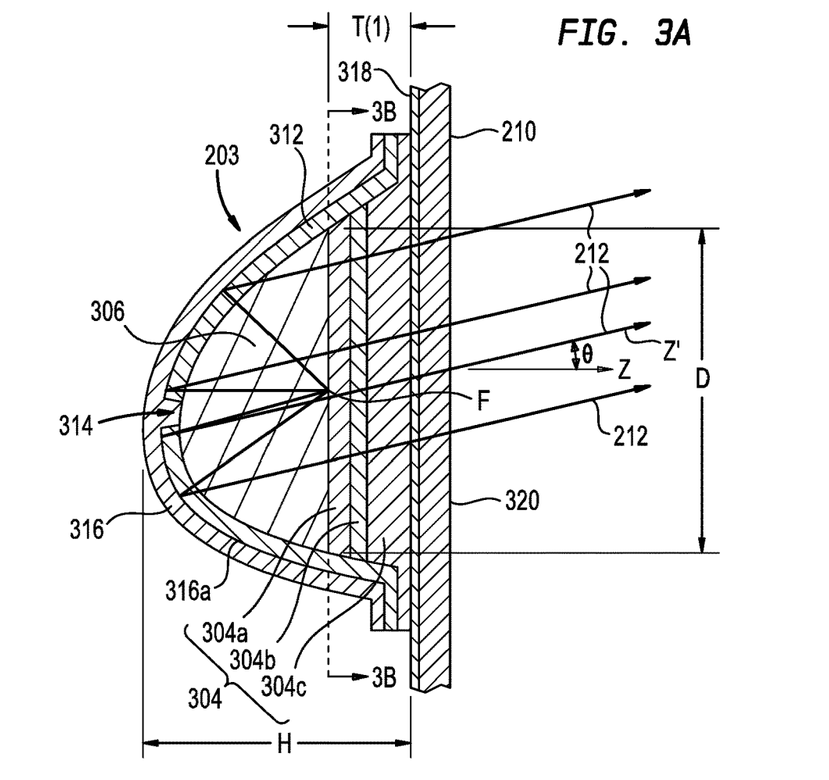
FIG. 3A is a schematic cross-sectional view of a micro-LED device, such as a micro-LED device used in the micro-LED arrays described in FIGS. 2A-2C, according to one embodiment.
Figure 3B:
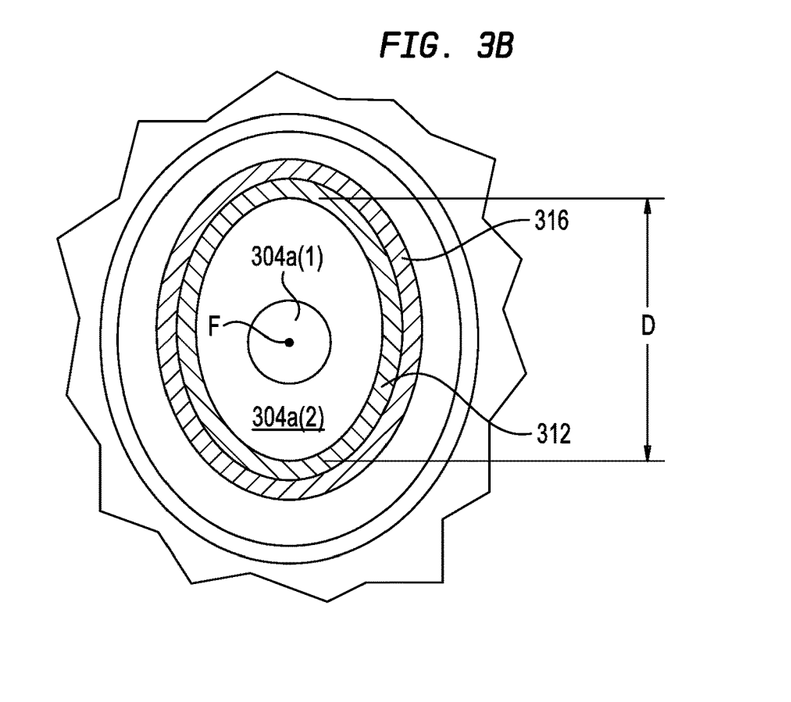
FIG. 3B is a sectional view of a portion of the micro-LED device described in FIG. 3A taken along line 3B-3B of FIG. 3A.

FIG. 3A is a schematic cross-sectional view of a micro-LED device disposed on a portion of a display panel, such as a micro-LED device 203 used in the micro-LED array 202 described in FIGS. 2A-2C, according to one embodiment. FIG. 3B is a sectional view of a portion of the micro-LED device described in FIG. 3A taken along line 3B-3B of FIG. 3A, according to some embodiments. Herein, the micro-LED device 203 includes an active layer stack 304, a transparent conductive oxide (TCO) layer 306 disposed on the active layer stack 304, an electrically insulating layer 312, such as dielectric layer, disposed on the active layer stack 304, and an electrically conductive reflective layer 316, such as a metal layer, disposed on the electrically insulating layer 312.

Typically, the active layer stack 304 of the micro-LED devices 203 described herein is formed of one or more III-V materials, such as GaAs, GaN, InGaN, AlGaInP, or combinations thereof, and includes a p-type layer 304a, an n-type layer 304c, and one or more quantum well (QW) layers 304b interposed between the p-type layer 304a and the n-type layer 304c. In some embodiments, the blue and green micro-LED devices 203b,g are formed using an active layer stack 304 that includes a InGaN layer interposed between a p-type GaN layer and n-type GaN layer, where the wavelength of light emitted by the active layer stack 304, and thus the color of light provided by the micro-LED, is determined by relative concentrations of indium and gallium in the InGaN layer. Alternatively, dopants, or color filter layers, may be used to provide the different output colors of the micro-LED devices 203. In some embodiments, the red micro-LED devices 203r are formed using an active layer stack 304 that includes an AlGaInP layer interposed between a p-type GaP layer and an n-type GaAs layer. Herein, the micro-LED device 203 is mounted to the display panel 320 using a transparent conductive adhesive (TCA) layer 318 disposed therebetween, where major surface of the active layer stack 304 are substantially parallel to the display surface 210. Typically, the active layer stack 304 has a thickness T(1) between about 10 nm and about 50 μm, such as between about 10 nm and about 5 μm, between about 10 nm and about 500 nm, between about 10 nm and about 100 nm, or between about 10 nm and about 50 nm, for example about 30 nm and forms an ohmic contact with the TCO layer 306 at the surfaces therebetween. Herein, the TCO layer 306 is formed of a transparent conductive oxide material such as indium tin oxide (ITO) or doped conductive zinc-oxide, such as aluminum doped zinc oxide (AZO) or gallium doped zinc oxide (GZO).

The material composition of the TCO layer 306 is selected based on the material composition and material properties, e.g, work function, of the active layer stack 304 so that there is ohmic contact and, or, tunneling contact between at least a portion of the TCO layer 306 and the active layer stack 304, and provide desirable optical transparency so that light emitted by the active layer stack 304 and reflected by the reflective layer 316 is able to travel therethrough. In one embodiment, the TCO layer 306 is formed of a p-type TCO material. Herein, the TCO layer 306 is formed on the active layer stack 304 using any suitable deposition method including chemical vapor deposition (CVD), physical vapor deposition (PVD), and plasma enhanced (PE) deposition methods, such as PECVD and PEPVD.

Herein, the TCO layer 306 and at least a portion of the active layer stack 304 form an elliptical paraboloid shape, such as a substantially circular paraboloid shape (i.e., the shape of a surface obtained by revolving a parabola about its axis of symmetry Z') at surfaces proximate to the dielectric layer 312. The electrically insulating layer 312 is typically formed of a transparent dielectric material, such as silicon oxide, silicon nitride, or combinations thereof. Herein, the electrically insulating layer 312 is desirably conformal to the circular paraboloid shape of surfaces of the TCO layer 306 and at least portions of the surfaces of the active layer stack 304 disposed therebeneath so that a reflective surface 316a of the reflective layer 316 disposed on the electrically insulating layer 312 forms an elliptical parabolic mirror, such as a circular parabolic mirror, having a focal point F at or proximate to a surface of the p-type layer 304a. An opening 314 formed in the electrically insulating layer 312 enables a p-contact between the reflective layer 316, disposed through the opening 314, and the TCO layer 306. In some embodiments, the TCA layer 318 provides an n-type contact to the active layer stack 304.

The material composition of the TCA layer 318 is selected based on the material composition and material properties, e.g, work function, of the active layer stack 304 to provide ohmic contact and, or, tunneling contact therebetween as well as to provide desirable optical transparency. In one embodiment, the TCA layer 318 is formed of an n-type TCA material. Herein, the TCA layer 318 is formed using any suitable deposition method including chemical vapor deposition (CVD), physical vapor deposition (PVD), and plasma enhanced (PE) deposition methods, such as PECVD and PEPVD. In other embodiments, the micro-LED device 203 is mounted to the display surface 210 using a transparent electrically non-conductive adhesive. In some embodiments, the micro-LED device 203 further includes a sapphire layer (not shown) disposed between the active layer stack 304 and the display panel 320 where the sapphire layer of the micro-LED device 203 is bonded to the display panel using a electrically non-conductive transparent adhesive layer (not shown). In other embodiments, the micro-LED device 203 is mounted to a back panel (not shown).

Typically, a surface of the active layer stack 304 proximate to the TCO layer has a diameter D along the major axis thereof. In some embodiments, the diameter D is less than about 100 µm, such as less than about 50 µm, less than about 20 µm, less than about 10 µm, for example less than about 5 µm, or between about 0.1 µm and about 10 µm, such as between about 0.5 µm and about 10 µm, for example between about 0.5 µm and about 5 µm. In some embodiments, a ratio of the diameter D to a height of the micro-LED device, herein height H, is more than about 0.2, such as more than about 0.3, more than about 0.4, more than about 0.5, more than about 0.8, for example more than about 1.

In some embodiments, portions of the surface of the p-type layer 304a are selectively treated, for example plasma treated, to desirably form a non-or-low-light transmission region 304a(2) circumscribing a light transmission region 304a(1). Plasma treating the surface of the p-type layer in the non-or-low-light transmission region 304a(2) desirably increases the resistance of the ohmic contact with the TCO layer 306 disposed thereon to bound an area of effective light transmission from the active layer stack 304 to a light transmission region 304a(1) centered about the focal point F. Bounding the area of light transmission to a region about the focal point F desirably increases the collimation of light provided by the micro-LED device 203.

For micro-LED devices 203 where the desired direction of collimated light rays 212 is substantially orthogonal to the display surface 210, such as the collimated light rays 212.1 provided by the micro-LED group 208.1, the axis of symmetry Z' of the reflective surface 316a is in substantially the same direction as the Z-direction. For micro-LED devices where a desired direction of collimated light rays 212 deviates from the Z-direction by the angle θ, such as for collimated light rays 212.2-212.9, the axis of symmetry Z' of the reflective surface 316a deviates from the Z-direction by about the angle θ. Therefore, in some embodiments, the axis of symmetry Z' of the reflective surface 316a and the major surfaces of the active layer stack 304 form an angle that is less than or more than 90°, such as between about 60° and less than 90° or between more than 90° and less than about 120°, such as less than 89° or more than 91°, such as less than about 88° or more than 92°, for example less than 85° or more than 95°.

Figure 4:
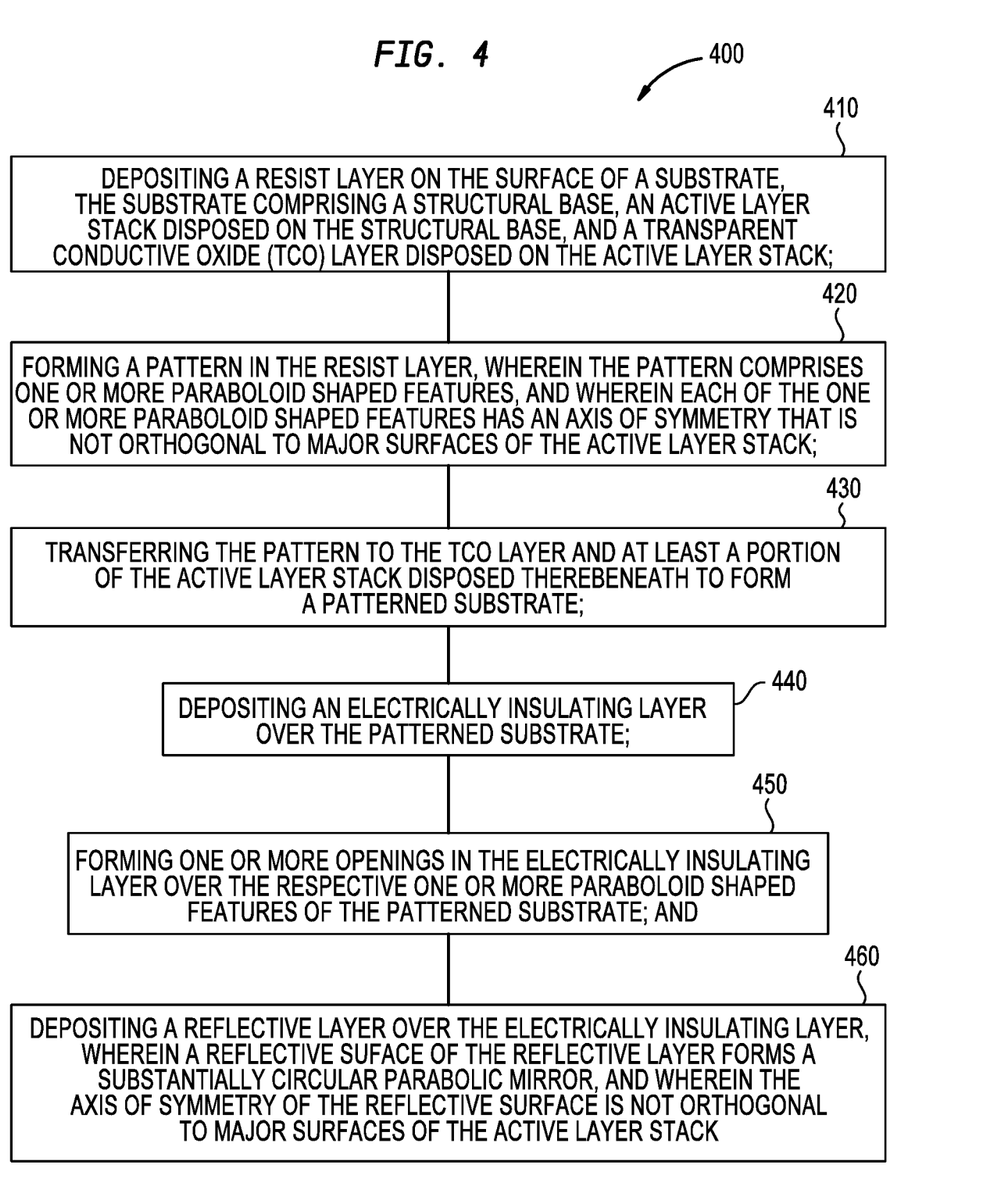
FIG. 4 is a flow diagram illustrating a method of forming a micro-LED device, such as the micro-LED device described in FIGS. 3A-3B, according to one embodiment.

FIG. 4 is a flow diagram illustrating a method 400 of forming one or more micro-LED devices, such as the micro-LED device 203 described in FIG. 3, according to one embodiment. FIGS. 5A-5G illustrate the method 400 described in FIG. 4.

Figure 5A:
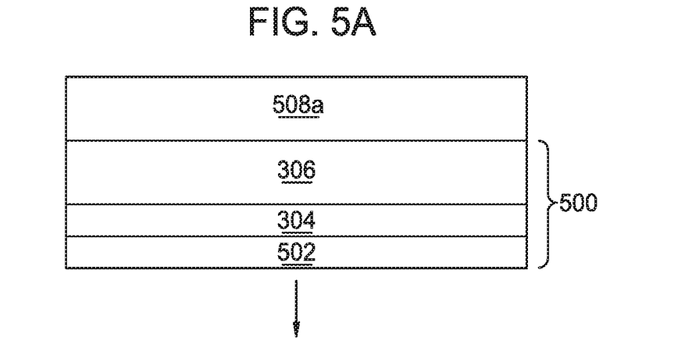
FIGS. 5A-5G illustrate the method described in FIG. 4.

At activity 410 the method 400 includes depositing a resist layer, such as the resist layer 508a shown in FIG. 5A, on the surface of a substrate 500. Herein, the substrate 500 includes a structural base 502, an active layer stack 304 disposed on the structural base 502, and a transparent conductive oxide (TCO) layer 306 disposed on the active layer stack 304. Typically, the structural base 502 is formed of a lattice-matching material, such as sapphire or silicon carbide, and one or more layers of the active layer stack 304 are epitaxially formed thereon. The resist layer 508a herein comprises a UV curable resin material deposited and/or dispensed onto the surface of the substrate 500 using conventional means, such as but not limited to slot die coating, inkjet printing, gravure printing, spin-on coating, or a combination thereof. In some embodiments, the resist layer 508a is formed from a plurality of droplets of the UV curable resin material. In other embodiments, the resist layer 508a comprises an electron-sensitive resin material or a thermal curable resin material. Herein, the resist layer 508a is formed of a positive resist material. In other embodiments, a method of forming one or more micro-LED devices uses a negative resist material.

At activity 420 the method 400 includes forming a pattern in the resist layer 508a. In one embodiment, forming the pattern in the resist layer 508a includes physically imprinting a pattern into the resist layer 508a using an imprint lithography (IL) stamp, such as the IL stamp shown in FIG. 5B. Herein, the IL stamp 510 includes one or more paraboloid shaped openings 512 formed therein. Physically pressing the IL stamp 510 into the resist layer 508a displaces the resin material about the pattern of the IL stamp. The resin material is cured using electromagnetic radiation, such as an ultra-violet (UV) radiation, provided through the IL stamp to form a patterned resist layer 508b comprising one or more paraboloid shaped features. Herein, an axis of symmetry Z' of the surface of the paraboloid shaped openings 512, and thus the axis of symmetry of the resulting paraboloid shaped features formed in the patterned resist layer 508b, deviates from a Z-direction which is orthogonal to a horizontal plane defined by the surface of the IL stamp 510. In some embodiments, the axis of symmetry Z' deviates from the Z-direction by an angle θ of more than 0°, such as more than about 1°, or more than about 2°, for example more than 5°, or between more than 0° and about 45°, such as between more than 0° and about 30°, such as between about 0.5° and about 30°. Typically, the IL stamp 510 is formed of a material that is transparent to the electromagnetic radiation 514, such as UV radiation, used to cure the resin material of the resist layer 508. In other embodiments, the patterned resist layer 508b is formed using a thermal imprint lithography process where the IL stamp is heated to a desired temperature and the resin material of the resist layer 508a is thermally cured to form the patterned resist layer 508b. In other embodiments, the IL stamp 510 is formed using a maskless direct write lithography process, i.e., a digital lithography process, for example an electron beam (e-beam) or optical direct write lithography process.

Figure 5B:
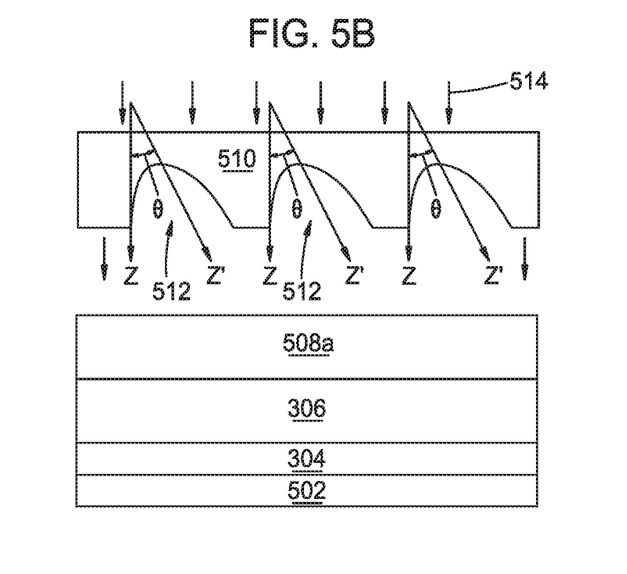

For a macro-pixel, corresponding to a micro-LED array 202, where each of the micro-LED devices 203 other than the one directing light in the Z-axis have the same angular deviation from the Z-direction, herein angle θ, a single IL stamp can be used in the formation of the plurality of parabolic shapes formed in the patterned resist layer 508b. In FIG. 5B, the axes of symmetry Z' of the paraboloid shaped openings 512 each deviate from the Z-direction by substantially the same angle θ and in substantially the same direction (e.g. N, S, W, E, and directions therebetween) with respect to a surface of the IL stamp 510. In other embodiments, for example for a macro-pixel, corresponding to a micro-LED array 202, where at least some of the micro-LED devices 203 other than the ones directing light in the Z-direction have different angular deviation from the Z-direction, herein angle θ, the IL stamp 510 includes a plurality of paraboloid shaped openings 512 having a respective plurality of axes of symmetry Z' that deviate from the Z direction by a respective plurality of different angles θ and/or in a respective plurality of different directions, which is useful in reducing the number of pick and place operations needed to form a micro-LED array 202, as described further in FIGS. 6 and 7A-7C.

Figure 5C:
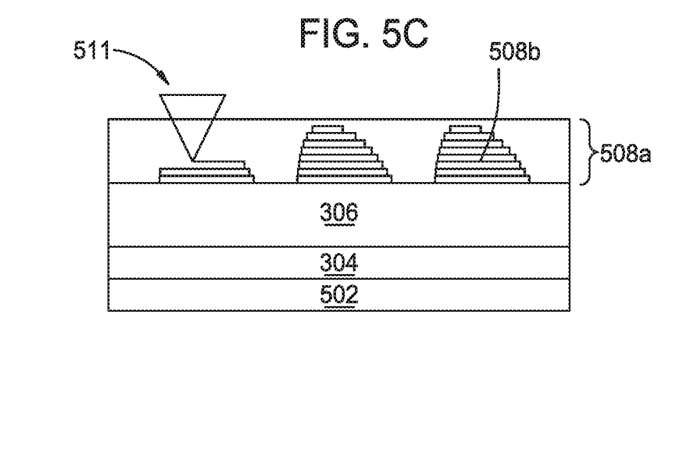
Figure 5D:
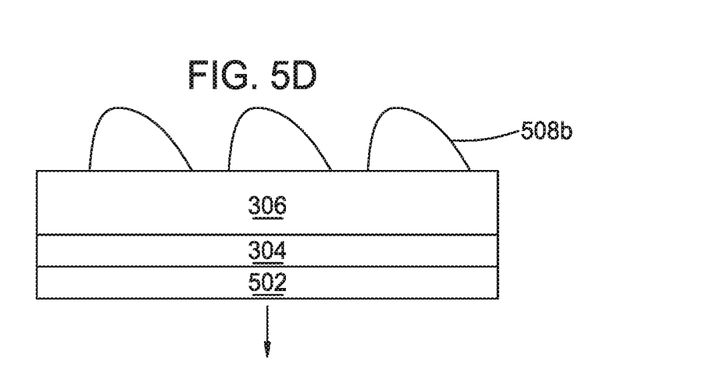

In another embodiment, forming a pattern in the resist layer at activity 420 comprises a maskless lithography process, such as e-beam direct write lithography process or an optical direct write lithography process, such as the optical direct write lithography process illustrated in FIG. 5C. Herein, an e-beam or a beam of focused radiation, such as the focused UV light beam 511, or a laser beam, is used to directly write (i.e., expose) an image into the resist layer 508a. Typically, the resist layer 508a is formed of an electron-sensitive resist material (for an e-beam process) or a light sensitive resist material (for an optical process), such as a UV light sensitive resist material. Herein, the resist layer 508a is formed of a positive resist material so that unexposed resist material is selectively removed to form the patterned resist layer 508b shown in FIG. 5D. Typically, the image used to form the patterned resist layer 508b is a digital image, such as a bitmap image. In other embodiments, the patterned resist layer is formed using a grey-scale lithography process, or a combination of a direct write lithography process and a grey-scale lithography process.

Figure 5E:
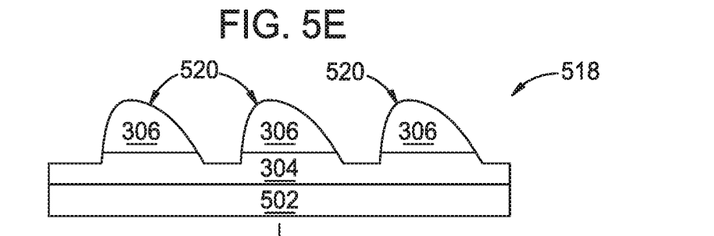
Figure 5F:
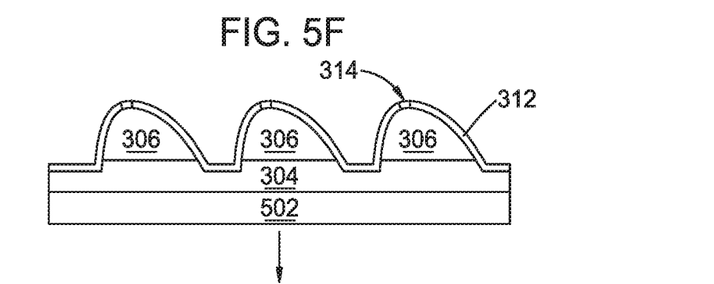

At activity 430 the method 400 further includes transferring the pattern formed in the patterned resist layer 508b to the TCO layer 306 and the active layer stack 304 disposed therebeneath to form a patterned substrate, such as the patterned substrate 518 of FIG. 5E comprising one or more paraboloid shaped features 520. Typically, the pattern is transferred using a dry etch process, such as an inductively coupled plasma (ICP) etch process or a reactive ion etching (RIE) process.

At activities 440, 450, 460 the method 400 further includes depositing an electrically insulating layer 312 onto the patterned substrate 518, forming one or more openings 314 in the electrically insulating layer 312, using conventional methods, such as lithographic patterning and etching, and depositing a reflective layer 316 over the electrically insulating layer 312 to form one or more micro-LED devices, such as the micro-LED device 203 described in FIG. 3. In one embodiment, the reflective layer 316 is deposited using a conventional gap-fill method to ensure the material thereof fills the opening 314 which enables ohmic contact between the reflective layer 316 and the TCO layer 306.

Figure 5G:
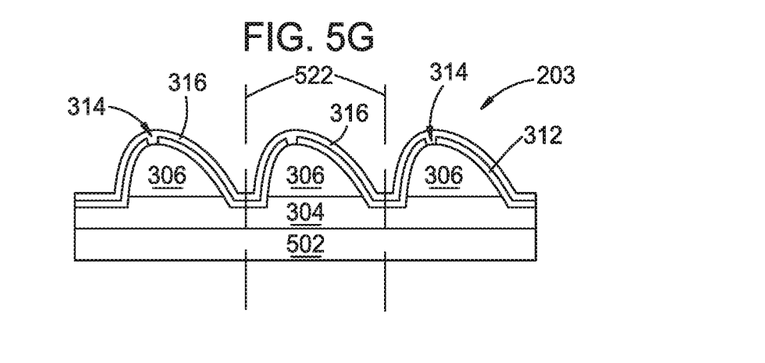

In some embodiments, the method 400 includes singulating the one or more micro-LED devices 203 along the singulation lines 522 shown in FIG. 5G. Singulating the one or more micro-LED devices 203 is typically done using laser scribing, mechanical sawing, water/solvent knifing, ion beam milling, a multi-layer photolithography etch process, or a combination thereof.

In some embodiments, the method 400 further includes removing all or a portion of the structural base 502 from the one or more micro-LED devices 203 before and/or after the singulation thereof. In some embodiments, the structural base 502 is removed from the one or more micro-LED devices 203 using a conventional laser liftoff process, a chemical mechanical polishing (CMP) process, a wet-etch process, or a combination thereof.

Figure 6:
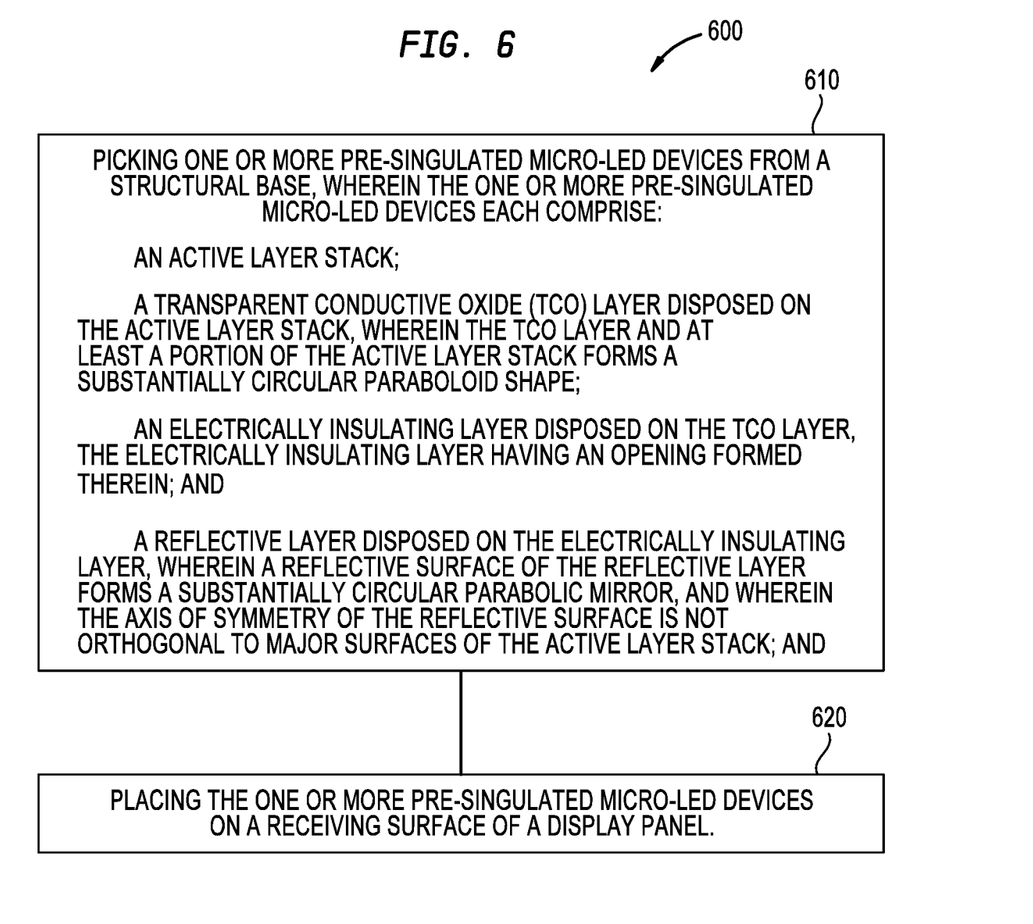
FIG. 6 is a flow diagram illustrating a method of forming a light field display, according to one embodiment.
Figure 7A:
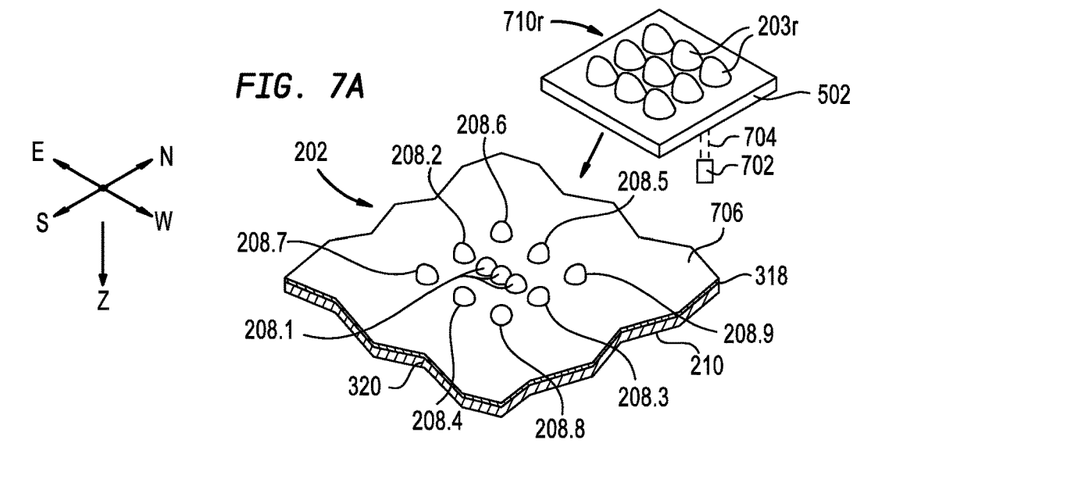
FIGS. 7A-7C illustrate the method described in FIG. 6.
Figure 7B:
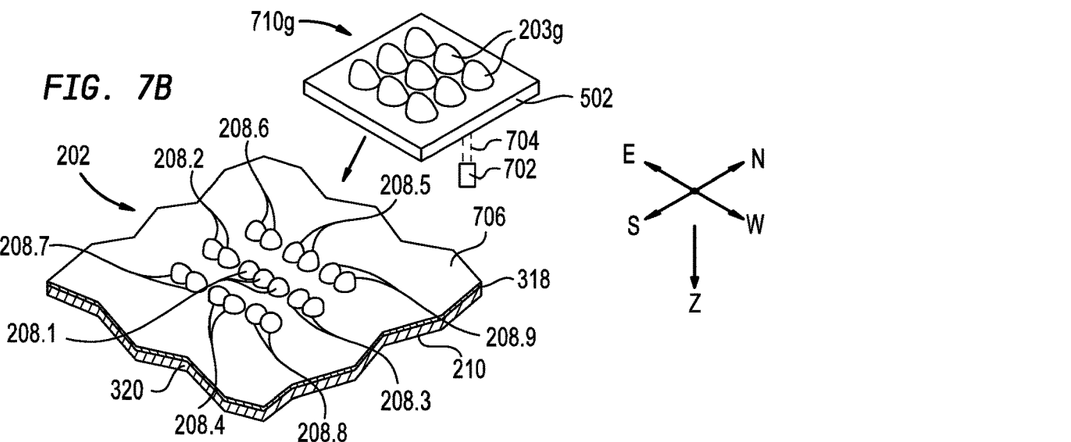
Figure 7C:
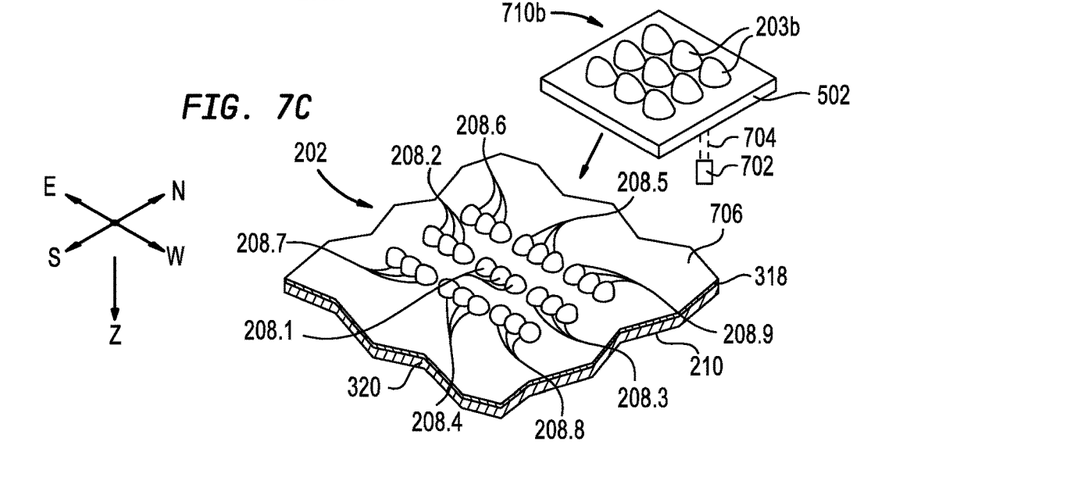

FIG. 6 is a flow diagram illustrating a method of forming a light field display, according to one embodiment. FIGS. 7A-7C Illustrate the method described in FIG. 6. At activity 610 the method 600 includes picking one or more pre-singulated micro-LED devices of a first color, such as the red micro-LED devices 203r shown in FIG. 7A, a second color, such as the green micro-LED devices 203g shown in FIG. 7B, and a third color, such as the blue micro-LED devices 203b shown in FIG. 7C from the structural bases 502 of a respective micro-LED device source 710r, 710g, and 710b and placing them in the desired position on the receiving surface 706 as further described at activity 620. In some embodiments, the micro-LED device sources 710r, 710g, and/or 710b are formed according to embodiments described herein. In some embodiments, each of the plurality of micro-LED devices 203r,g,b of the respective micro-LED device sources 710r,g,b are formed on a respective structural base 502, where each have a desired axis of symmetry Z' that deviates from the Z direction by substantially the same angle θ, each desirably emit substantially the same wavelength of light, and each are disposed in substantially the same direction (e.g., N, S, W, E and/or therebetween) with respect to a surface of the respective structural base 502. In other embodiments, one or more of the micro-LED sources 710r,g,b include a plurality of respective micro-LED devices 203,r,g,b comprising a plurality of desired axes of symmetry Z' deviating from the Z-direction in a respective plurality of angles θ. In some other embodiments, the axes of symmetry Z' or the plurality of micro-LED devices 203 are disposed in a respective plurality of different directions (N, S, W, E and/or therebetween) with respect to a surface of the respective structural base 502.

Typically, the micro-LED devices 203r,g,b shown in FIGS. 7A-7C comprises an active layer stack, a transparent conductive oxide (TCO) layer disposed on the active layer stack, wherein the TCO layer and at least a portion of the active layer stack forms a substantially circular paraboloid shape, an electrically insulating layer disposed on the TCO layer, the electrically insulating layer having an opening formed therein, and a reflective layer disposed on the electrically insulating layer, where a reflective surface of the reflective layer forms a substantially circular parabolic mirror, and where the axis of symmetry of the reflective surface is not orthogonal to major surfaces of the active layer stack. In some embodiments, picking the one or more pre-singulated micro-LED devices 203r,g,b from the structural base further includes de-bonding the micro-LED device 203r,g,b from the structural base using a laser 704 provided by a laser source 702.

At activity 620 the method 600 further includes placing the one or more pre-singulated micro-LED devices 203r,g,b on a receiving surface 706 of a display panel 320. The receiving surface 706 of the display panel 320 is distal from the display surface 210 and includes a transparent conductive adhesive (TCA) layer 318 disposed thereon. Herein, the TCA layer 318 provides a common n-type connection to the to be placed micro-LED devices 203r,g,b. In other embodiments, the TCA layer 318 forms a discontinuous surface comprising a plurality of TCA patches (not shown) each configured to provide an individual n-type connection a respective to be placed micro-LED device 203r,g,b. In some embodiments, the display panel 320 is formed of a rigid or flexible transparent material such as glass or a transparent polymer, for example a polyethylene terephthalate (PET) sheet or a polyethylene terephthalate (PEN) sheet. In some embodiments, the transparent polymer sheet is disposed on a rigid glass, metal, or plastic base to facilitate handling of the light field display during the manufacturing process. In some embodiments, the display panel 320 is coated with an anti-reflective coating using to reduce the refractive index thereof.

Herein, placing the one or more pre-singulated micro-LED devices 203r,b,g, comprises individually positioning each of the micro-LED devices 203r,b,g or concurrently positioning a collection of micro-LED devices 203r,b,g at desired locations on the receiving surface 706 and with desired directional components (N, S, E, W and/or therebetween) with respect to the display surface 210. For example, if the micro-LED devices 203r,b,g of the respective micro-LED sources 710r,g,b of FIGS. 7A-7C all comprise devices having substantially the same axis of symmetry Z' orientated in substantially the same direction, such as N, on their structural base 502, the individual micro-LED device 203r, b,g are positioned on the receiving surface 706 so that the individual micro-LED devices comprising micro-LED group 208.5 are all oriented with their axis of symmetry Z' is in a N direction which provides a primary light emission direction 212.5 (shown in FIGS. 2C and 2D) which is (N, θ). Likewise the micro-LED devices comprising micro-LED group 208.6, 208.2, 208.7, 208.4, 208.8, 208.3, and 208.9 are positioned so that the respective primary light emission directions 212.6, 212.2, 212.7, 212.4, 212.8, 212.3, and 212.9 are respectively (NE, θ), (E, θ), (SE, θ), (S, θ), (SW, θ), (W, θ), and (NW, θ). In FIGS. 7A-7C the individual micro-LED devices 203r,g,b of micro-LED groups 208.1-208.9 are arranged so that each micro-LED device 203r,g,b of a respective micro-LED group 208 is proximate to and/or adjacent to other members of the group. In other embodiments, the micro-LED devices 203r,g,b of a micro-LED group 208 are positioned and/or arranged at any location within the micro-LED array 202. For example, in embodiments where a micro-LED device source 710r,g,b comprises a plurality of micro-LED devices having a plurality of axes of symmetry Z' deviating from the Z-direction by plurality of angles θ and/or in a respective plurality of different directions (e.g., N, S, E, W, and directions therebetween) a plurality of micro-LED devices 203r,g, or b can be collectively picked from the respective micro-LED device source 710r,g, or b and collectively placed on the receiving surface 706 of the display panel 320 which desirably reduces the number of pick and place operations in the assembly of a light field display 200. In some other embodiments, collections of micro-LED devices 203r,g, and/or b are arranged on a transfer carrier substrate (not shown) before being collectively transferred to the receiving surface 706 of the display panel 320 and positioned thereon.

In other embodiments, a mass transfer pick and place system is used to transfer a plurality of pre-singulated micro-LED devices 203r, g, or b comprising the same r, g, or b color and the same theta orientation to the receiving surface of a single display panel, such as the display panel 320. In these embodiments, the plurality of pre-singulated micro-LED devices 203 r, g, or b (having the same color, angle θ, and compass direction) are transferred in a single mass transfer pick and place operation or operational sequence which reduces production time and costs associated therewith. Typically the plurality of pre-singulated micro-LED devices transferred in single mass transfer pick and place operation or operational sequence comprises more than 20%, more than 30%, or at least about 50%, such as about 100% of the pre-singulated micro-LED devices 203 r, g, or b (having the same color, angle θ, and compass direction) used to form a single panel display, e.g., more than 1 million micro-LED devices (having the same color, angle θ, and compass direction). Herein, the term about with respect to the number of micro-LED devices 203 transferred includes allowances to correct for misplacement of improperly transferred micro-LED devices or replacement of non-functioning micro-LED devices.

In other embodiments, the light field display is formed by picking and placing a plurality of micro-LED devices onto a back panel of the light field display so that light from the micro-LED devices is emitted in a direction away from the major surfaces of the back panel. In some of those embodiments, the micro-LED devices further comprise a planarized dielectric layer disposed over the reflective layer, where conductive interconnects formed through the planarized dielectric layer enable n-type and p-type connections to the micro-LED device. In some other embodiments, the light field display is formed using a roll-based multi-device (e.g., micro-LED device) transfer system.

The method 600 described above contemplates a light field display where each pixel of angular resolution comprises micro-LED arrays having micro-LED devices that at least emit sub-pixels of red, green, and blue light. In other embodiments, the pick and place methods described in FIG. 6 are used to form a light field display comprising micro-LED devices that emit sub-pixels of different colors of light and/or fewer colors of light (e.g., mono-chromatic or di-chromatic light field displays).

While the foregoing is directed to embodiments of the present disclosure, other and further embodiments of the disclosure may be devised without departing from the basic scope thereof, and the scope thereof is determined by the claims that follow.

What is claimed is:

1. A light field display, comprising:
   a plurality of micro-LED arrays;
   wherein each micro-LED array provides a pixel of spatial resolution comprising a plurality of pixels of angular resolution;
   wherein each micro-LED array comprises a plurality of micro-LED devices providing the plurality of pixels of angular resolution;
   wherein each of the plurality micro-LED devices comprises a reflective surface forming a substantially circular parabolic mirror; and
   wherein one or more of the plurality of micro-LED devices comprises:
   an active layer stack,
   a transparent conductive oxide (TCO) layer disposed on the active layer stack, wherein the transparent conductive oxide (TCO) layer and at least a portion of the active layer stack form a substantially circular paraboloid shape,
   an electrically insulating layer disposed on the transparent conductive oxide (TCO) layer, the electrically insulating layer having an opening formed therein, and
   a reflective layer disposed on the electrically insulating layer, wherein the reflective layer comprises the reflective surface, and wherein the axis of symmetry of the reflective surface is not orthogonal to major surfaces of the active layer stack.

2. The light field display of claim 1, wherein each micro-LED array comprises a plurality of micro-LED groups, each of the plurality of micro-LED groups comprising at least three micro-LED devices, wherein each of the at least three micro-LED devices emit a different color of light from that of the others to each provide a sub-pixel of angular resolution.

3. The light field display of claim 2, wherein the three different colors of light comprise red, green, and blue.

4. The light field display of claim 2, wherein the at least three micro-LED devices comprise a blue light emitting micro-LED device, a green light emitting micro-LED device, and a red light emitting micro-LED device.

5. The light field display of claim 1, wherein
the active layer stack of the one or more of the plurality of micro-LED devices comprises an n-type layer, a p-type layer, and one or more quantum well layers interposed between the n-type layer and the p-type layer, and
a focal point of the reflective surface is proximate to a surface the p-type layer.

6. The light field display of claim 5, wherein the active layer stack provides red light, a green light, or a blue light.

7. The light field display of claim 5, wherein the plurality of micro-LED devices are mono-chromatic.

8. The light field display of claim 5, wherein a surface of the p-type layer comprises a light emissive region about the focal point and a non or low light emissive region circumscribing the light emissive region.

9. A micro-LED device, comprising:
an active layer stack;
a transparent conductive oxide (TCO) layer disposed on the active layer stack, wherein the transparent conductive oxide (TCO) layer and at least a portion of the active layer stack forms a substantially circular paraboloid shape;
an electrically insulating layer disposed on the TCO layer, the electrically insulating layer having an opening formed therein; and
a reflective layer disposed on the electrically insulating layer, wherein a reflective surface of the reflective layer forms a substantially circular parabolic mirror, and wherein the axis of symmetry of the reflective surface is not orthogonal to major surfaces of the active layer stack.

10. The micro-LED device of claim 9, wherein
the active layer stack comprises an n-type layer, a p-type layer, and one or more quantum well layers interposed between the n-type layer and the p-type layer, and
a focal point of the reflective surface is proximate to a surface the p-type layer.

11. The micro-LED device of claim 10, wherein the active layer stack provides a red light, a green light, or a blue light.

* * * * *